(12) United States Patent
Schoner et al.

(10) Patent No.: US 8,581,918 B2
(45) Date of Patent: Nov. 12, 2013

(54) METHOD AND SYSTEM FOR EFFICIENTLY ORGANIZING DATA IN MEMORY

(71) Applicant: Broadcom Corporation, Irvine, CA (US)

(72) Inventors: Brian Schoner, Fremont, CA (US); Darren Neuman, Palo Alto, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/735,582

(22) Filed: Jan. 7, 2013

(65) Prior Publication Data

US 2013/0120420 A1 May 16, 2013

Related U.S. Application Data

(63) Continuation of application No. 11/627,168, filed on Jan. 25, 2007, now Pat. No. 8,350,865.

(51) Int. Cl.
*G06F 13/372* (2006.01)

(52) U.S. Cl.
USPC ............................. 345/534; 345/531; 345/536

(58) Field of Classification Search
USPC ........................................... 345/531, 534, 536
See application file for complete search history.

(56) References Cited

U.S. PATENT DOCUMENTS

| | | | |
|---|---|---|---|
| 6,480,199 B1 | 11/2002 | Oomori et al. | |
| 7,522,171 B1 * | 4/2009 | Nordquist | ..................... 345/581 |
| 8,350,865 B2 * | 1/2013 | Schoner et al. | ............... 345/534 |
| 2002/0149596 A1 | 10/2002 | Champion et al. | |
| 2003/0169262 A1 * | 9/2003 | Lavelle et al. | ................. 345/531 |

* cited by examiner

*Primary Examiner* — Maurice L McDowell, Jr.
(74) *Attorney, Agent, or Firm* — Thomas Horstemeyer, LLP

(57) ABSTRACT

A method and system for efficiently organizing data in memory is provided. Exemplary aspects of the invention may include storing linear data and block data in more than one DRAM device and accessing the data with one read/write access cycle. Common control signals may be used to control the DRAM devices and the address lines used to address each DRAM device may be independent from one another. The data read from the DRAM devices may be reordered to make the data more suitable for processing by applications.

21 Claims, 8 Drawing Sheets

| Dev 0 0x000 | Dev 1 0x000 | Dev 2 0x000 | Dev 3 0x000 | Dev 0 0x004 | Dev 1 0x004 | Dev 2 0x004 | Dev 3 0x004 | Dev 0 0x008 | Dev 1 0x008 | Dev 2 0x008 | Dev 3 0x008 | Dev 0 0x00C | Dev 1 0x00C | Dev 2 0x00C | Dev 3 0x00C |
|---|---|---|---|---|---|---|---|---|---|---|---|---|---|---|---|
| Dev 2 0x010 | Dev 3 0x010 | Dev 0 0x010 | Dev 1 0x010 | Dev 2 0x014 | Dev 3 0x014 | Dev 0 0x014 | Dev 1 0x014 | Dev 2 0x018 | Dev 3 0x018 | Dev 0 0x018 | Dev 1 0x018 | Dev 2 0x01C | Dev 3 0x01C | Dev 0 0x01C | Dev 1 0x01C |
| Dev 3 0x020 | Dev 2 0x020 | Dev 1 0x020 | Dev 0 0x020 | Dev 3 0x024 | Dev 2 0x024 | Dev 1 0x024 | Dev 0 0x024 | Dev 3 0x028 | Dev 2 0x028 | Dev 1 0x028 | Dev 0 0x028 | Dev 3 0x02C | Dev 2 0x02C | Dev 1 0x02C | Dev 0 0x02C |
| Dev 1 0x030 | Dev 0 0x030 | Dev 3 0x030 | Dev 2 0x030 | Dev 1 0x034 | Dev 0 0x034 | Dev 3 0x034 | Dev 2 0x034 | Dev 1 0x038 | Dev 0 0x038 | Dev 3 0x038 | Dev 2 0x038 | Dev 1 0x03C | Dev 0 0x03C | Dev 3 0x03C | Dev 2 0x03C |

METHOD AND SYSTEM FOR EFFICIENTLY ORGANIZING DATA IN MEMORY

CROSS-REFERENCE TO RELATED APPLICATIONS/INCORPORATION BY REFERENCE

This application is a continuation of U.S. application Ser. No. 11/627,168, filed Jan. 25, 2007, now U.S. Pat. No. 8,350,865, issued Jan. 8, 2013, which is incorporated herein by reference in its entirety.

FIELD OF THE INVENTION

Certain embodiments of the invention relate to storing data in memory. More specifically, certain embodiments of the invention relate to a method and system for efficiently organizing data in memory.

BACKGROUND OF THE INVENTION

Many electronic devices use memory for storing data. For instance, computer systems typically contain large amounts of memory for storing applications and data. But computer systems may take forms other than the familiar desktop computer. For example, televisions and set-top-boxes may contain several microprocessors and memories for running a variety of applications. Along with the familiar menu navigation applications running on these systems, there may be applications for encoding and decoding video information. For example, a set-top-box may have an MPEG decoder application as well.

In many cases, a system, such as a set-top-box, may have separate subsystems for specific applications and those subsystems may utilize separate memories for their respective storage needs. For example, a system may comprise an MPEG encoder subsystem. The MPEG subsystem may use a digital signal processor (DSP) and a memory interfaced to the DSP. In this regard, data within the memory may be structured so as to make the encoding/decoding process as efficient as possible. For example, the data may be stored so that data corresponding to blocks of pixels may be accessed efficiently. The same system may have a simple microcontroller unit (MCU) for executing, for example, a menu application for performing tasks such as on screen menu navigation. The MCU may be interfaced to a memory other than the DSP memory described above. Like the DSP, the MCU may also structure data within the memory so as to run its own applications as efficiently as possible. For example, the MCU may prefer to access data in a linear manner.

The system cost for a system that uses separate memories for separate subsystems may be prohibitively expensive. Sharing memory among the various subsystems may be another solution. But this may result in less efficient access to memory and therefore may decrease the operating speeds of the various subsystems. Each subsystem may have different read/write requirements. For example, one subsystem may use an 8-bit read/write access, while another may use a 12-bit read/write access, and yet another may use a 16-bit read/write access. In addition each subsystem may have its own read/write timing requirements. Given these issues, an MPEG encoder, forced to access memory linearly, may require additional cycles to retrieve a block of pixels.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for efficiently organizing data in memory, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

BRIEF DESCRIPTION OF THE DRAWINGS

FIG. 4 is a block diagram of an exemplary arrangement for storing data among a plurality of memory devices, in accordance with an embodiment of the invention.

FIG. 5 is a block diagram illustrating exemplary frame and field access, in accordance with an embodiment of the invention.

DETAILED DESCRIPTION

Certain embodiments of the invention may be found in a method and system for efficiently organizing data in memory. Exemplary aspects of the invention may include storing linear data and block data in more than one DRAM device and accessing the data with one read/write access cycle. Common control signals may be used to control the DRAM devices and the address lines used to address each DRAM device may be independent from one another. The data read from the DRAM devices may be reordered to make the data more suitable for processing by applications.

Figure 1:
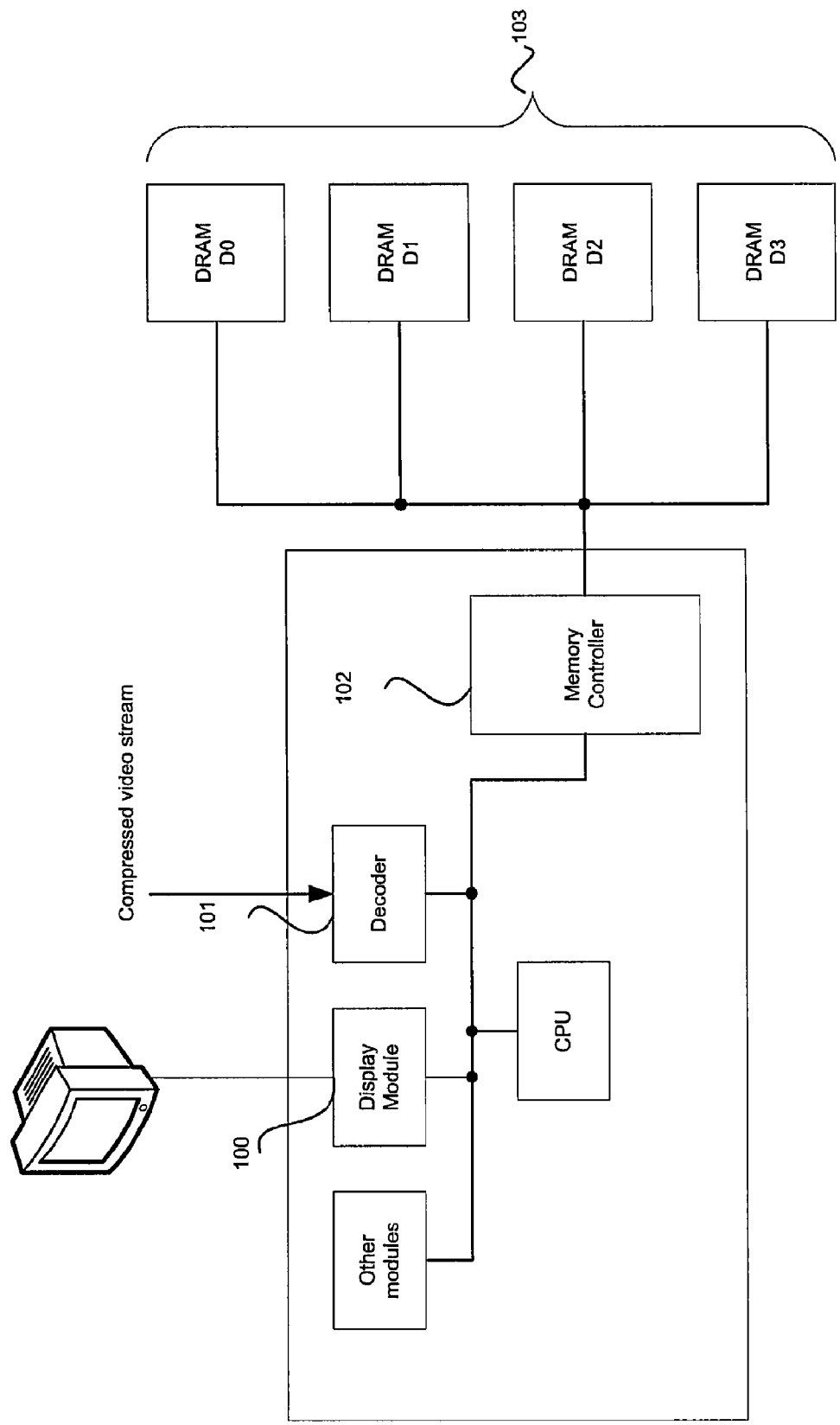
FIG. 1 is a block diagram illustrating an exemplary video processing system, in accordance with an embodiment of the invention.

FIG. 1 is a block diagram illustrating an exemplary video processing system, in accordance with an embodiment of the invention. Referring to FIG. 1, there is shown a memory controller 102, several DRAM devices 103, a display module 100, and a compressed video decoder 101. The compressed video decoder 101 may comprise suitable logic, circuitry, and/or code that may enable receiving a stream of compressed video and converting the compressed video into a frame of video. For example, the compressed video decoder 101 may conform to an MPEG standard and may decode the compressed video stream and store blocks of pixels corresponding to the compressed video via the memory controller into the several DRAM devices 103.

The display module 100 may comprise suitable logic, code, and/or circuitry that may enable reading data corresponding to a frame of video from memory and displaying the pixels on a display device. In this regard, the display module 100 may read the data out of the several DRAM devices 103 via the memory controller 102 in the same order in which the data may be displayed on the display. For example, the display module 100 may draw the display from left to right and top to bottom. In this case, the display module 100 may read data from the several DRAM devices 103, at least conceptually, from left to right and top to bottom.

The memory controller 102 may comprise suitable logic, circuitry, and/or code than may enable storing data into and retrieving data from several DRAM devices using a plurality of access methods. For example, if the display module 100 requests access to a line of pixels, the memory controller 102 may access the data stored in the several DRAM devices 103 linearly. If the compressed video decoder 101 requests access to a block of pixels, the memory controller 102 may access the data stored in the several DRAM devices 103 in a block fashion. The memory controller 102 may store data such that adjacent pixels may be stored in different DRAM devices. For example, each pixel in a block of pixels and each pixel in a row or column of pixels may be stored in different DRAM device. This may enable retrieving a block, row, or column of pixels in a single access cycle.

Figure 2:
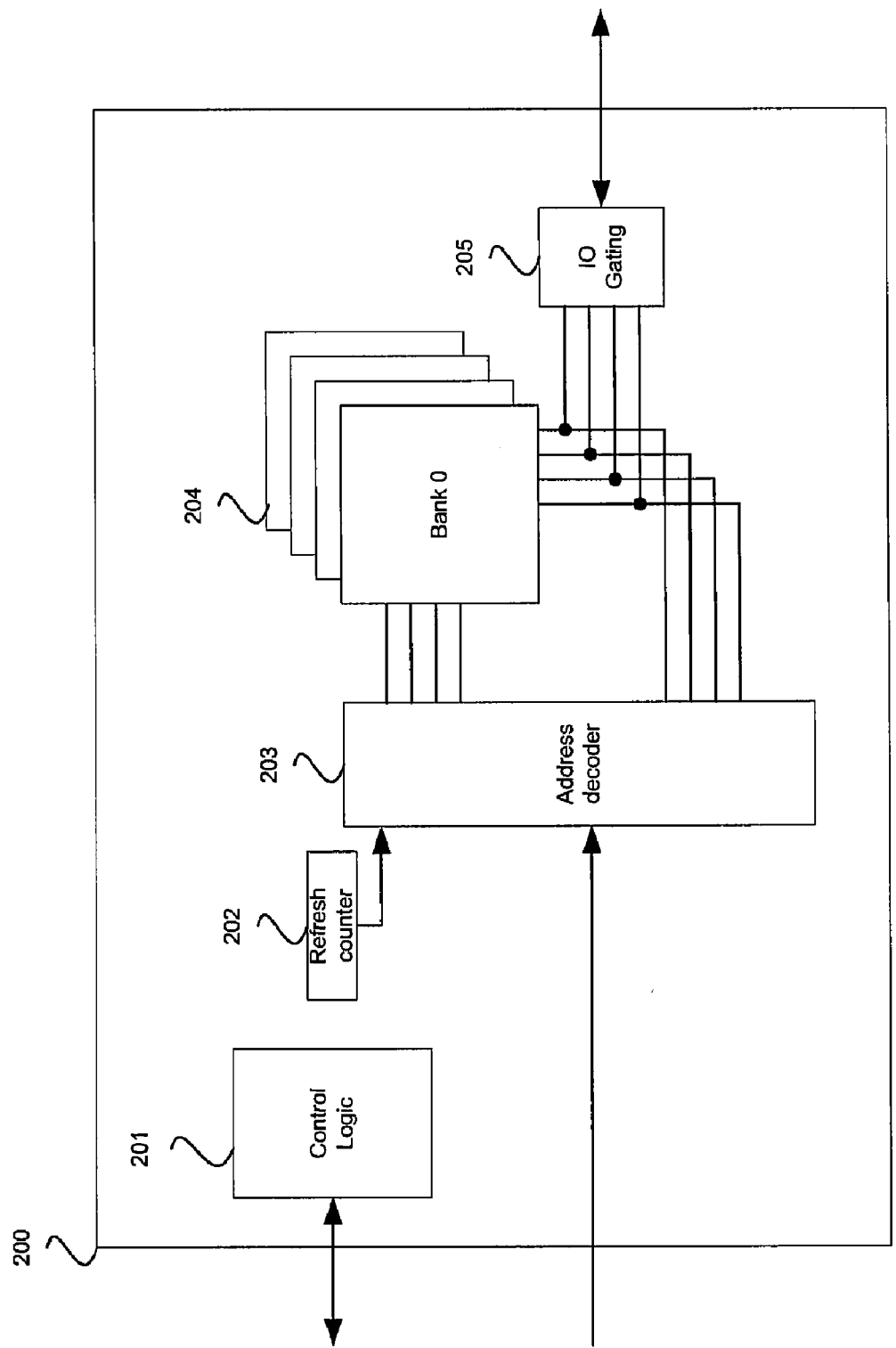
FIG. 2 is a block diagram illustrating an exemplary DRAM device, which may be utilized in connection with an embodiment of the invention.

FIG. 2 is a block diagram illustrating an exemplary DRAM device, which may be utilized in connection with an embodiment of the invention. Referring to FIG. 2, there is shown a DRAM device 200, a control logic block 201, a refresh counter 202, an address decoder 203, several banks of memory 204, and an IO gating block 205.

The control logic block 201 may comprise suitable logic, circuitry, and/or code for accepting various commands and for carrying out the specific operations associated with those commands. For example, an "active" command may be used to open or activate a row in a particular bank for a subsequent access. A "read/write" command may be used to initiate a burst "read/write" access to an active row. A "precharge" command may be used to deactivate the open row in a particular bank or the open row in all banks so that capacitive elements in those rows may be refreshed.

The refresh module 202 may comprise suitable logic, circuitry, and/or code for charging capacitive storage elements within the several banks of memory 204 so as not to lose the data represented by the charge level. This may be necessary because the capacitive storage elements within a bank of memory may gradually lose their charge. In this regard, the refresh module may periodically access one of the several banks of memory, determine whether the charge on any given capacitive storage element may be greater than a threshold, and may increase the charge on the capacitive element if the charge exceeds the threshold. The refresh module 202 may operate periodically or upon a command issued through the control logic block 201.

The address decoder 203 may comprise suitable logic, circuitry, and/or code for selecting a row within one of the several banks for subsequent access. For example, a CPU may read a row within, for example, bank 0 by asserting the address that corresponds to that row and bank and issuing a read command via the control logic block 201. The data at the selected address may then be available for access via the IO gating block 205.

The IO gating block 205 may comprise suitable logic, circuitry, and/or code for accessing a selected row of data within a selected bank. In this regard, the row and bank may be selected by asserting an address to the address decoder 203. A subsequent "read" or "write" command may be asserted via the control logic block 205 to read or write data to the selected row within the selected bank.

The several banks of memory 204 may comprise suitable logic, circuitry, and/or code for storing data. The banks of memory may be divided into rows of data. The individual rows may comprise capacitive storage elements for storing a charge associated with a data bit. Only one row within a bank of memory may be accessible at a particular time. In this regard, the row may have to be "opened" before any "read" or "write" command may be issued. This may be accomplished via the "active" command described above. A subsequent "active" command to a different row in the same bank may only be issued after the previous active row has been "closed."

Figure 3A:
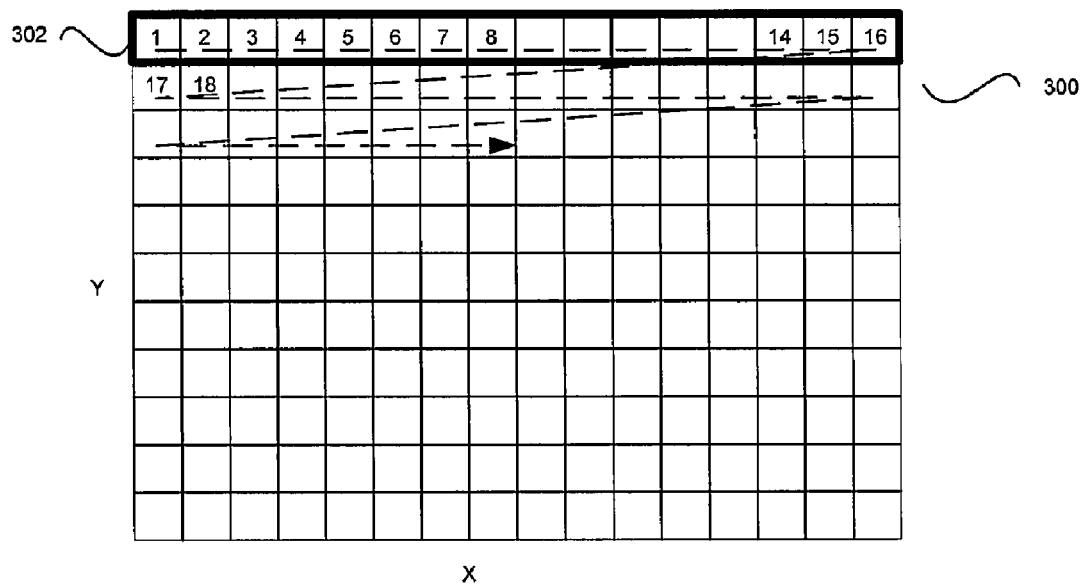
FIG. 3A is a block diagram illustrating exemplary storage of data in a linear access pattern, which may be utilized in connection with and embodiment of the invention.

FIG. 3A is a block diagram illustrating exemplary storage of data in a linear access pattern, which may be utilized in connection with and embodiment of the invention. Referring to FIG. 3A, there is shown a linear access pattern 300 and a row of pixels 302. The linear access pattern may be used when the data to be stored lends itself to a sequential arrangement in memory. For example, a row of pixels 302 representing a line of video may be stored in a sequential arrangement. Subsequent lines of video may be appended to the end of previous lines. Conceptually, the memory may be viewed as X pixels wide by Y pixels high, where X and Y may be the respective width and height in pixels of a display device. It may be more efficient for a display device to access the memory in the same manner in which it may be displayed. In other words, if a display device draws from left to right and top to bottom, it may be more efficient for the display device to scan a memory with an image at least conceptually from left to right and top to bottom.

Figure 3B:
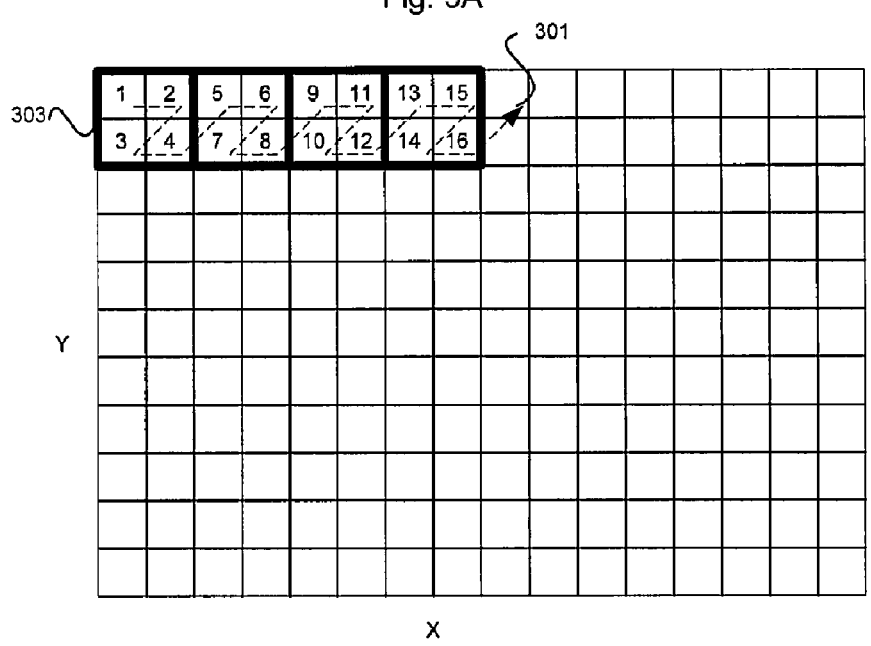
FIG. 3B is a block diagram illustrating exemplary storage of data using a block access pattern, which may be utilized in connection with an embodiment of the invention.

FIG. 3B is a block diagram illustrating exemplary storage of data using a block access pattern, which may be utilized in connection with an embodiment of the invention. Referring to FIG. 3B, there is shown a block access pattern 301 and four blocks of pixels 303. The block access pattern 301 may be used when the data to be stored lends itself to a block arrangement. For example, an MPEG encoder may perform motion estimation by processing blocks of pixels 303 from a video frame. In this case, it may be more efficient for the encoder to read using a block access pattern 301 instead of the linear access pattern described above. For example, assuming sixteen pixels could be read in a single read cycle, four blocks of pixels 303 may be retrieved using a single read cycle. By contrast, if a linear access pattern was used, two read cycles might be required to access the same group of pixels. In this regard, in the case of a single memory device, data may have to be stored using an access pattern tailored to a particular need. In other words, if the data is going to be displayed to a display, a linear access pattern may result in the most efficient storage pattern. Likewise, a block storage pattern may be the most efficient for processing that involves blocks of pixels.

FIG. 4 is a block diagram of an exemplary arrangement for storing data among a plurality of memory devices, in accordance with an embodiment of the invention. Referring to FIG. 4, there is shown memory locations corresponding to an 8 byte access 400, a 32 byte linear access 401, an 8 byte by 4 line access 402, and a 16 byte by 2 line block access 403. The storage arrangement of FIG. 4 may be realized by using multiple memories with similar characteristics. For example, four memories may be used all having, for example, a 64-bit interface, an 8 KB combined page size, and 4 banks. In this regard, by arranging individual memory devices as shown in FIG. 4, data stored within the devices may not have to be stored in any particular way. In other words, linear accesses to memory may be just as efficient as block accesses to memory. For example, a 32 byte linear access 401 may be accomplished by applying the same address to four different devices. And a 16 byte by 2 line block access 403 may be accomplished by applying a first address to a first and second device and a different address to a third and fourth device. In both examples, the access time may be the same. Thus, a display device may, for example, use the 32 byte linear access 401 to read memory because that access method may be more suitable to displaying pixels on a display. And, for example, an MPEG encoder may use the 16 byte by 2-line block access 403 to read memory because that type of access may be more suitable to MPEG encoding.

Figure 5:
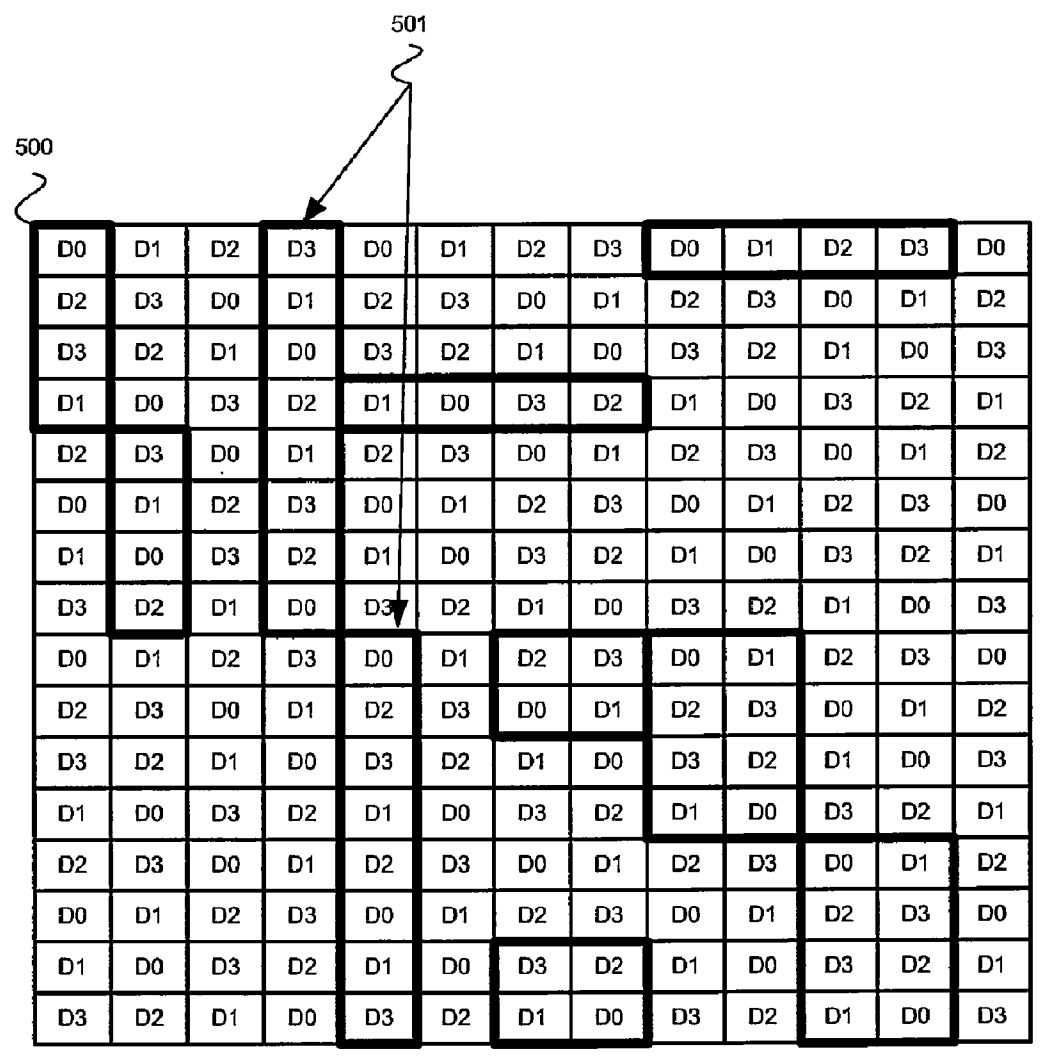

FIG. 5 is a block diagram illustrating exemplary frame and field access, in accordance with an embodiment of the invention. Referring to FIG. 5, there is shown a frame access 500 and a field access 501. The frame access 500 may be used, for example, to retrieve pixels from four consecutive lines of video. This type of access may be useful in processing progressively scanned images and may be accomplished by using an 8 byte by 4 line access 402 (FIG. 4). Similarly, a field access may be used to retrieve pixels from every other line of video. This type of access may be useful for processing interlaced video images and may also be accomplished by using the 8 byte by 4 line access 402. In either type of access, the pixels comprising the group may be in separate memory devices. For example, in a frame access 500, the individual pixels may reside in devices 0, 2, 3, and 1 respectively. For an interlaced field access 501, the individual pixels for an even field may reside in devices 3, 0, 1, and 2 respectively and the pixels for the odd field may reside in devices 1, 2, 3, 2 respectively.

Figure 6:
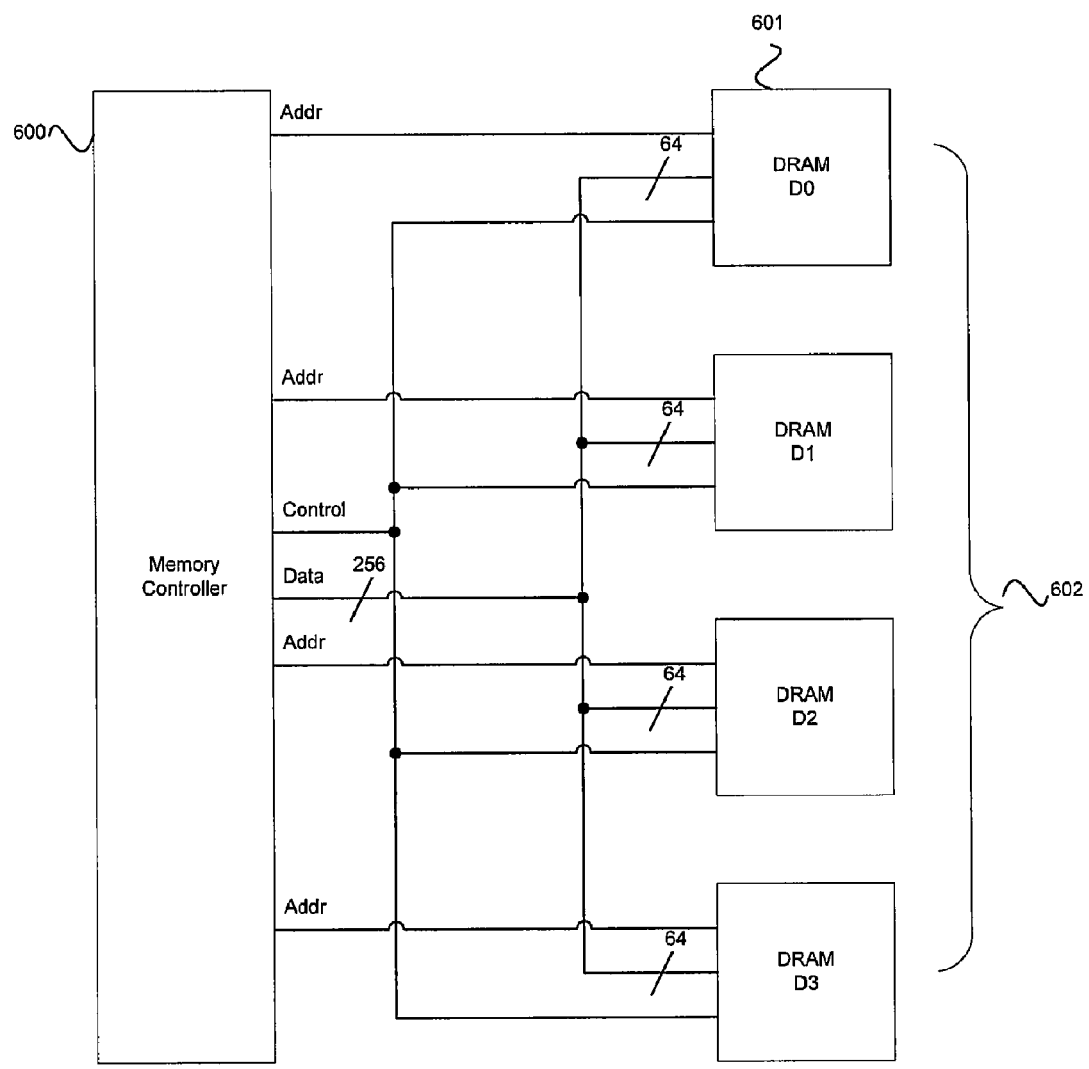
FIG. 6 is a block diagram illustrating an exemplary system for efficiently storing data into several DRAM devices, in accordance with an embodiment of the invention.

FIG. 6 is a block diagram illustrating an exemplary system for efficiently storing data into several DRAM devices, in accordance with an embodiment of the invention. Referring to FIG. 6, there is shown a memory controller 600 and several DRAM devices 601. The DRAM devices 601 may comprise suitable logic, circuitry and/or code for storing and retrieving data as described above.

The memory controller 600 may comprise suitable logic, circuitry, and/or code for interfacing a microprocessor system to one or more memories. The interface may be comprised of a control bus, address bus and data bus. The control bus may be used to control the operation of the several DRAM devices. In this regard, the several DRAM devices may share control lines. In this way, the several DRAM devices may always be in the same state as one another and this may improve efficiency. For example, using common control lines may insure that all the devices may be, for example, in a "read" state or a "precharge" state at the same. Otherwise, if separate control lines were used, one device may be in a precharge state while the others may be in a "ready to read" state. In this case, the memory controller may have to wait for the device in the "precharge" state to finish before data may be transferred, thus delaying the transfer of data. By using common control lines, this issued may be alleviated.

The memory controller may use an address bus to specify the address within the respective memory where the read or write may take place and may further use a data bus to communicate the data to and from the device. In this regard, the address bus may be partitioned in such a way so that the memory controller may address each DRAM independently. This may allow the data to be stored in a variety of patterns within the several DRAM devices. For example, by using separate address signals, the data may be partitioned, for example, in the linear access pattern and block access pattern described above. In this regard, some of the signals on the address bus may be shared among the several DRAM devices. For example, referring to FIG. 4, the lower four bits of the address may be the same regardless of the type of access. Thus, in a 8 byte by 4 line access 402 (FIG. 4), the lower 4 bits of the address for the memory devices may, for example, be 0x8. Or in a 16 byte by 2 line block access 403 (FIG. 4) the lower four bits of the address for the memory devices may be 0xC.

Figure 7:
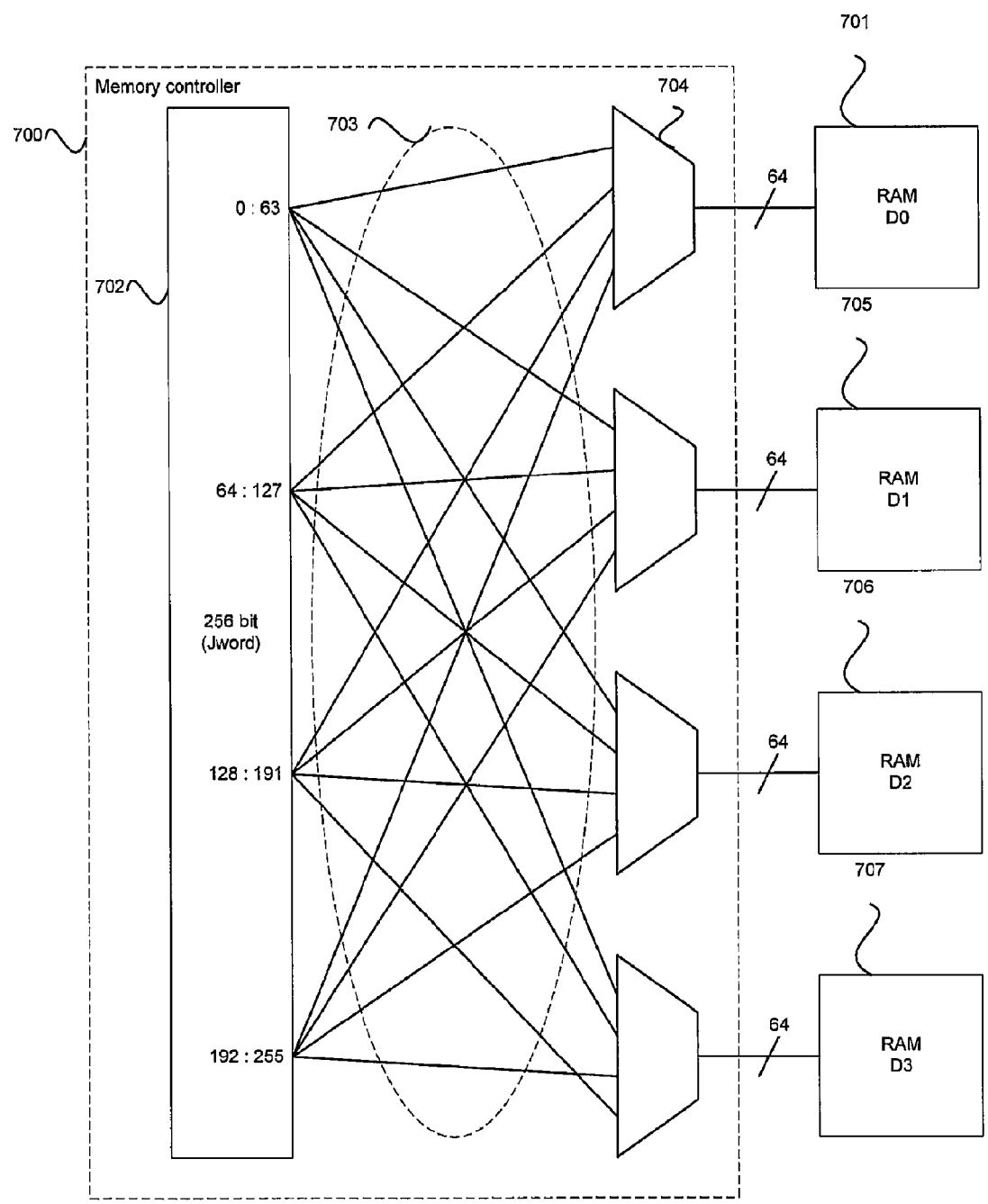
FIG. 7 is a block diagram illustrating an exemplary system for muxing data lines, in accordance with an embodiment of the invention.

FIG. 7 is a block diagram illustrating an exemplary system for muxing data lines, in accordance with an embodiment of the invention. Referring to FIG. 7, there is shown a memory controller 700 and several DRAM devices 701. The memory controller 700 may comprise an internal data portion 702, a series of interconnects 703, and several muxes 704.

The muxes 704 may comprise suitable logic, code and/or circuitry for translating data stored in a plurality of memories to data usable by a processor. The muxes may perform the translation by routing external data signals from the DRAM device, through the series of interconnects 703 to the internal data portion 702. This translation may allow efficient access to linear, block, field and frame portions of a memory. For example, referring to FIG. 4, if a 256 bit linear access at address 0x004 is required and the endianness is, for example, big-endian, the muxes may route bits 192-255 to device D3 707, bits 128-191 to device D2 706, bits 64-127 to device D1 705, and bits 0-63 to device D0 701. This routing order may change depending on the location of the requested data and the format of the data. For example, if a 256 bit linear access the data at address 0x14 is requested instead, the muxes may route bits 192-255 to device D1 705, bits 128-191 to device D0 701, bits 64-127 to device D3 707, and bits 0-63 to device D2 706. By passing the data through muxes, the way in which the data may be physically stored in the several DRAM devices may be transparent to, for example, an application accessing data.

Figure 8:
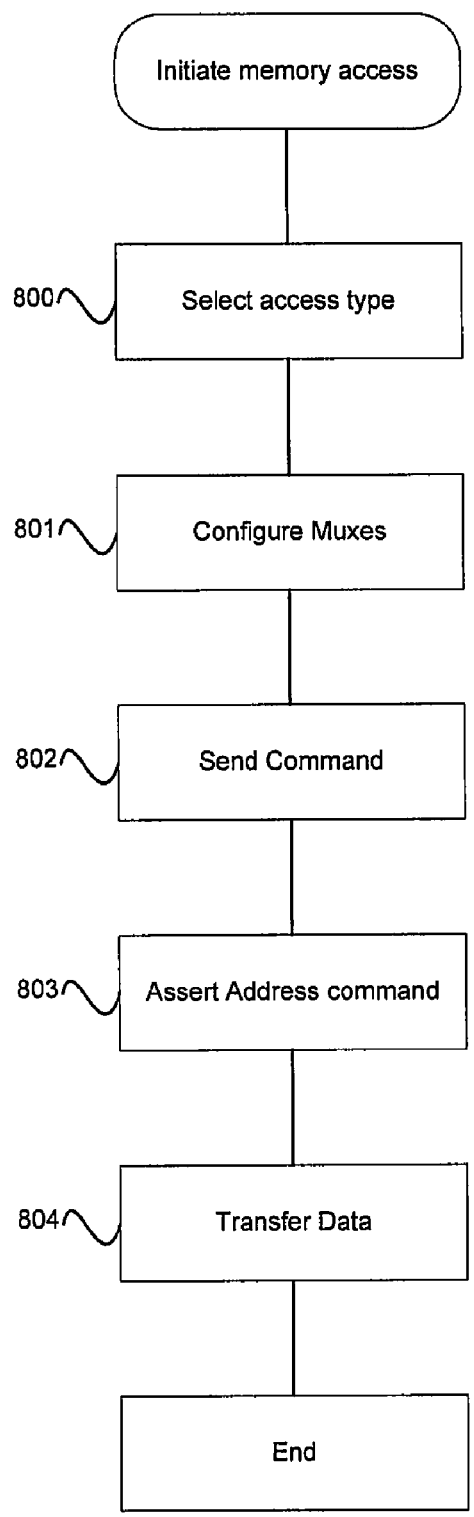
FIG. 8 is a block diagram illustrating an exemplary flow diagram of a system for efficiently storing data to DRAM devices, in accordance with an embodiment of the invention.

FIG. 8 is a block diagram illustrating an exemplary flow diagram of a system for efficiently storing data to DRAM devices, in accordance with an embodiment of the invention. Referring to FIG. 8, at step 800, a command may be issued to the memory controller 700 (FIG. 7) by an application running on a microprocessor specifying the type of access. For example, an MPEG application reading a frame of video may select a 16 byte by 2-line block access 403 (FIG. 4). An application that draws pixels to a display may select a 32 byte linear access 401 (FIG. 4). At step 801, the memory controller 700 may configure the muxes 704 (FIG. 7) accordingly so that, for example, the data corresponding to the type of access specified may be transferred. At step 802, the memory controller 700 may send a command to the several DRAM devices 601 (FIG. 6). For example, if the application is trying to access data stored within the several DRAM devices 601, a "read" command may be issued via the control bus.

If the application is trying to store data, a "write" command may be issued. At step 803, the address requested by the application may be translated by the memory controller 600 (FIG. 6). In this regard, separate address signals may be asserted to the several DRAM devices 601. For example, referring to FIG. 4, if an 8 byte by 4-line access is requested, the memory controller 600 may assert addresses 0x008, 0x018, 0x028, and 0x038 to DRAM devices 1, 3, 2, and 0 respectively. At step 804, the data may be transferred between the several DRAM devices 601 and the memory controller 600. In the case of a "read" command, the several DRAM devices 601 may present the data stored at the address location specified, on the output pins of the several DRAM devices 601. This data may then be translated via the muxes within the memory controller and subsequently transferred to the microprocessor. This approach may facilitate efficient access to a plurality of data structures stored within a memory.

Accordingly, the present invention may be realized in hardware, software, or a combination of hardware and software. The present invention may be realized in a centralized fashion in at least one computer system, or in a distributed fashion where different elements may be spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

Therefore, the following is claimed:

1. A method, comprising:
storing individual ones of adjacent pixels in a group of pixels in separate memory devices, wherein at least a portion of memory lines used to access individual ones of the separate memory devices are different; and
accessing the group of pixels in the separate memory devices using a single access cycle by multiplexing a control signal to individual ones of the separate memory devices according to a routing order based at least in part on a storage format of the group of pixels.

2. The method according to claim 1, wherein the control signal comprises a common input/output (I/O) control signal.

3. The method according to claim 1, comprising reordering data in the group of pixels.

4. The method according to claim 1, comprising storing individual ones of the adjacent pixels in said group linearly.

5. The method according to claim 1, comprising storing individual ones of the adjacent pixels in said group in a block fashion.

6. The method according to claim 1, comprising accessing individual ones of the adjacent pixels in the group linearly.

7. The method according to claim 1, comprising accessing individual ones of the adjacent pixels in the group in a block fashion.

8. A non-transitory computer-readable medium embodying a program executable in at least one computing device, the program causing the at least one computing device to perform steps comprising:
storing individual ones of adjacent pixels in a group of pixels in separate memory devices, wherein at least a portion of memory lines used to access each of the separate memory devices are different; and
accessing the group of pixels in the separate memory devices using a single access cycle by multiplexing a control signal to individual ones of the separate memory devices according to a routing order based at least in part on a storage format of the group of pixels.

9. The non-transitory computer-readable medium according to claim 8, wherein the control signal comprises a common input/output (I/O) control signal.

10. The non-transitory computer-readable medium according to claim 8, wherein the program enables reordering data in the group of pixels.

11. The non-transitory computer-readable medium according to claim 8, wherein the program enables storing individual ones of the adjacent pixels in the group linearly.

12. The non-transitory computer-readable medium according to claim 8, wherein the program enables storing individual ones of the adjacent pixels in the group in a block fashion.

13. The non-transitory computer-readable medium according to claim 8, wherein the program enables accessing individual ones of the adjacent pixels in the group linearly.

14. The non-transitory computer-readable medium according to claim 8, wherein the program enables accessing individual ones of the adjacent pixels in the group in a block fashion.

15. A system comprising:
one or more processors, one or more circuits, or any combination thereof that enable:
storing individual ones of adjacent pixels in a group of pixels in separate memory devices, wherein at least a portion of memory lines used to access each of the separate memory devices are different; and
accessing said group of pixels in said separate memory devices using a single access cycle by multiplexing a control signal to individual ones of the separate memory devices according to a routing order based at least in part on a storage format of the group of pixels.

16. The system according to claim 15, wherein the control signal comprises a common input/output (I/O) control signal.

17. The system according to claim 15, wherein the one or more processors or circuits enable reordering data in the group of pixels.

18. The system according to claim 15, wherein the one or more processors or circuits enable storing individual ones of the adjacent pixels in said group linearly.

19. The system according to claim 15, wherein the one or more processors or circuits enable storing individual ones of the adjacent pixels in the group in a block fashion.

20. The system according to claim 15, wherein the one or more processors or circuits enable accessing individual ones of the adjacent pixels in the group linearly.

21. The system according to claim 15, wherein the one or more processors or circuits enable accessing individual ones of the adjacent pixels in the group in a block fashion.

* * * * *